(12) United States Patent
Hastings

(10) Patent No.: US 6,885,224 B2
(45) Date of Patent: Apr. 26, 2005

(54) APPARATUS FOR COMPARING AN INPUT VOLTAGE WITH A THRESHOLD VOLTAGE

(75) Inventor: Roy Alan Hastings, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/126,826

(22) Filed: Apr. 20, 2002

(65) Prior Publication Data

US 2003/0197531 A1 Oct. 23, 2003

(51) Int. Cl.[7] .............................................. H03K 5/153
(52) U.S. Cl. ........................................ 327/78; 327/53
(58) Field of Search ...................... 327/53, 60, 77–81, 327/83, 72; 323/315

(56) References Cited

U.S. PATENT DOCUMENTS

| | | | | |
|---|---|---|---|---|
| 4,339,677 A | * | 7/1982 | Hoeft .......................... | 327/308 |
| 5,229,733 A | * | 7/1993 | Boezen et al. .............. | 330/298 |
| 5,523,709 A | * | 6/1996 | Phillips et al. .............. | 327/143 |
| 5,754,078 A | * | 5/1998 | Tamagawa ................... | 330/255 |
| 5,977,759 A | * | 11/1999 | Sitch ........................... | 323/315 |
| 6,091,226 A | * | 7/2000 | Amano ........................ | 320/116 |
| 6,504,419 B1 | * | 1/2003 | Damitio et al. ............. | 327/413 |
| 6,529,078 B1 | * | 3/2003 | Gosser et al. ............... | 330/255 |

OTHER PUBLICATIONS

"A Simple Three–Terminal IC Bandgap Reference", by A. Paul Brokaw; IEEE Journal of Solid–State Circuits; Dec. 1974; pp. 388–393.

* cited by examiner

*Primary Examiner*—My-Trang Nu Ton
(74) *Attorney, Agent, or Firm*—W. Daniel Swayze, Jr.; W. James Brady; Frederick J. Telecky, Jr.

(57) ABSTRACT

An apparatus for comparing an input voltage with a threshold voltage includes: (a) a first current mirror device that includes a first bipolar transistor with a first base and a first collector; the first base and the first collector establish a diode-connected first collector; the input voltage is received at the first current mirror device; (b) a second current mirror device that includes a second bipolar transistor with a second base and a second collector; the second base and the second collector establish a diode-connected second collector; (c) a first impedance coupled in series with the diode-connected first collector and the diode-connected second collector; and (d) a second impedance coupled between ground and the second current mirror device. The first and second current mirror devices are coupled with an output locus at which output signals appear to indicate relative voltage levels of the input and the threshold voltages.

16 Claims, 5 Drawing Sheets

APPARATUS FOR COMPARING AN INPUT VOLTAGE WITH A THRESHOLD VOLTAGE

BACKGROUND OF THE INVENTION

The present invention is directed to apparatuses for comparing an input voltage with a reference or threshold voltage. Such apparatuses are sometimes referred to as comparators. The present invention is preferably embodied in a bandgap comparator apparatus that compares an input voltage with an inherent threshold voltage presented, or established by the apparatus.

A bandgap comparator generates a digital output that transitions high when an input voltage exceeds an internally generated reference or threshold voltage. One problem with typical prior art bandgap comparator apparatuses is that they draw excessive current when the input voltage exceeds the threshold voltage.

There is a need for an apparatus for comparing an input voltage with a threshold voltage, such as a bandgap comparator, that reduces current drain without compromising accuracy of comparator thresholds.

SUMMARY OF THE INVENTION

A preferred embodiment of an apparatus for comparing an input voltage with a threshold voltage includes: (a) a first current mirror device that includes a first bipolar transistor with a first base and a first collector; the first base and the first collector establish a diode-connected first collector; the input voltage is received at the first current mirror device; (b) a second current mirror device that includes a second bipolar transistor with a second base and a second collector; the second base and the second collector establish a diode-connected second collector; (c) a first impedance coupled in series with the diode-connected first collector and the diode-connected second collector; and (d) a second impedance coupled between ground and the second current mirror device. The first current mirror device and the second current mirror device are further coupled with an output locus. Output signals appearing at the output locus indicate relative voltage levels of the input voltage and the threshold voltage.

It is, therefore, an object of the present invention to provide an apparatus for comparing an input voltage with a threshold voltage, such as a bandgap comparator, that reduces current drain without compromising accuracy of comparator thresholds.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
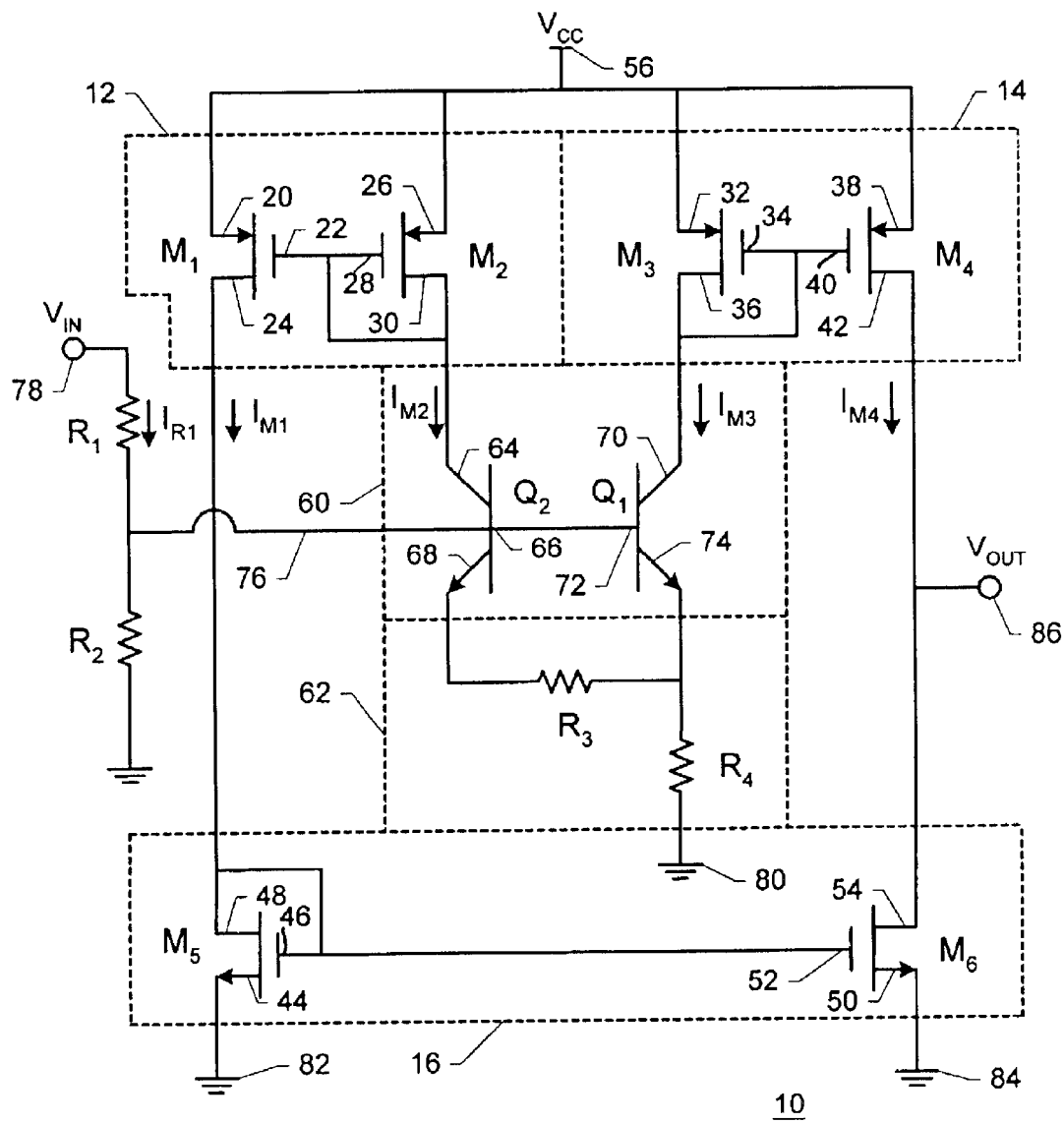
FIG. 1 is an electrical schematic diagram of a representative prior art comparator apparatus.

FIG. 1 is an electrical schematic diagram of a representative prior art comparator apparatus. In FIG. 1, a prior art comparator apparatus 10 is based upon a Brokaw bandgap cell, as generally described in "A Simple Three-Terminal IC Bandgap Reference," by A. Paul Brokaw; IEEE Journal of Solid-State Circuits; December 1974; pp. 388–393. Comparator apparatus 10 includes a first current mirror 12, a second current mirror 14 and a third current mirror 16. First current mirror 12 includes metal oxide semiconductor (MOS) transistors $M_1$, $M_2$; second current mirror 14 includes MOS transistors $M_3$, $M_4$; and third current mirror 16 includes MOS transistors $M_5$, $M_6$. MOS transistor $M_1$ has a source 20, a gate 22 and a drain 24. MOS transistor $M_2$ has a source 26, a gate 28 and a drain 30. MOS transistor $M_2$ has gate 28 coupled with drain 30 to establish the MOS transistor pair $M_1$, $M_2$ as current mirror 12.

MOS transistor $M_3$ has a source 32, a gate 34 and a drain 36. MOS transistor $M_4$ has a source 38, a gate 40 and a drain 42. MOS transistor $M_3$ has gate 34 coupled with drain 36 to establish the MOS transistor pair $M_3$, $M_4$ as current mirror 14.

MOS transistor $M_5$ has a source 44, a gate 46 and a drain 48. MOS transistor $M_6$ has a source 50, a gate 52 and a drain 54. MOS transistor $M_5$ has gate 46 coupled with drain 48 to establish the MOS transistor pair $M_5$, $M_6$ as current mirror 16. Drain 24 is coupled with drain 48. Drain 42 is coupled with drain 54. A supply voltage $V_{CC}$ is provided at a supply locus 56 that is coupled with sources 20, 26, 32, 38. Source 44 is coupled with ground 82. Source 50 is coupled with ground 84.

Comparator apparatus 10 also includes a sensing unit 60 and a scaling unit 62. Sensing unit 60 includes a pair of NPN bipolar transistors $Q_1$, $Q_2$. Transistor $Q_2$ has a collector 64, a base 66 and an emitter 68. Transistor $Q_1$ has a collector 70, a base 72 and an emitter 74. Emitter area $A_{e2}$ of emitter 68 of transistor $Q_2$ is larger than emitter area $A_{e1}$ of emitter 74 of transistor $Q_1$ by a factor of N. That is:

$$A_{e2} = N \cdot A_{e1} \quad [1]$$

Bases 66, 72 are coupled together. An input locus 76 is coupled with bases 66, 72. Resistors $R_1$, $R_2$ are coupled with input locus 76 and with an input node 78. Resistors $R_1$, $R_2$ scale input signals $V_{IN}$ applied to input node 78 for presentation at input locus 76.

Scaling unit 62 includes a resistor $R_3$ coupled with emitter 68 and with emitter 74, and a resistor $R_4$ coupled between emitter 74 and ground 80.

An output locus 86 is coupled with drains 42, 54; an output voltage $V_{OUT}$ appears at output locus 86 when voltage at input locus 76 exceeds a predetermined threshold. The threshold determination is inherent in comparator apparatus 10 and is related to the base-emitter voltage $V_{be}$ of transistor $Q_1$.

The base-emitter voltage of a bipolar transistor $V_{be}$ equals:

$$V_{be} = V_T \ln\left(\frac{I_C}{A_e J_s}\right) \quad [2]$$

Where $V_T$ is the thermal voltage, $I_C$ is the collector current, $A_e$ is the emitter area, and $J_S$ is the saturation current density.

If one assumes that current mirrors 12, 14, 16 all implement 1:1 current ratios, then a balance point is attainable at which currents through transistors M1, M2, M3, M4 are equal. That is, referring to FIG. 1, $$I_{M1}=I_{M2}=I_{M3}=I_{M4} \quad [3]$$

In such a balance point condition, collector currents $I_{C1}$, $I_{C2}$ of transistors $Q_1$, $Q_2$, respectively, are equal. That is, referring to FIG. 1, $$I_{C1}=I_{C2} \quad [4]$$

The voltage across resistor $R_3$ is therefore equal to the difference between base-emitter voltages $V_{be1}$, $V_{be2}$ for transistors $Q_1$, $Q_2$, respectively. That is, $$\Delta V_{be}=V_{be1}-V_{be2} \quad [5]$$

Substituting expression [2] into expression [5]:

$$\Delta V_{be} = V_T \ln\left(\frac{I_{C1}}{A_{e1} J_s}\right) - V_T \ln\left(\frac{I_{C2}}{A_{e2} J_s}\right) \quad [6]$$

Combining terms in expression [6], and canceling out the term $J_S$:

$$\Delta V_{be} = V_T \ln\left(\frac{I_{C1} A_{e2}}{I_{C2} A_{e1}}\right) \quad [7]$$

Recalling that in balance point conditions $I_{C1}=I_{C2}$, expression [4] becomes, $$\Delta V_{be} = V_T \ln\left(\frac{A_{e2}}{A_{e1}}\right) \quad [8]$$

Recalling further that $A_{e2}=N \cdot A_{e1}$, expression [8] becomes, $$\Delta V_{be}=V_T \ln(N) \quad [9]$$

The voltage at input locus 76 may be regarded as the bandgap voltage $V_{bg}$ for comparator apparatus 10. If one ignores base currents (for the sake of simplicity) one may observe that:

$$V_{bg} = 2V_T \frac{R_4}{R_3} \ln(N) + V_{be2} \quad [10]$$

The factor ($2V_T$) is necessary because currents from both transistors $Q_1$, $Q_2$ flows through resistor $R_4$, thus doubling the total voltage seen there. Resistors $R_3$, $R_4$ are derived from matched devices, so any temperature dependencies they may possess are equal and therefore cancel. Emitter area ratio N is substantially independent of temperature. The thermal voltage $V_T$ equals:

$$V_T = \frac{kT}{q} \quad [11]$$

Where k is Boltzmann's constant,

T is absolute temperature, and q is the charge on an electron.

Since k and q are temperature-invariant fundamental constants, the thermal voltage $V_T$ depends linearly upon absolute temperature. The first term on the right side of expression [10] therefore has a linear positive temperature coefficient. The second term on the right side of expression [10] is base-emitter voltage of transistor $Q_1$. The base-emitter voltage of a silicon bipolar transistor has a negative temperature coefficient of approximately −2 millivolts per degree Kelvin $$\left(-\frac{2mV}{K}\right).$$

The base-emitter voltage of a bipolar transistor varies nonlinearly with temperature. If this relationship is expanded as a power series upon temperature, the linear term will be found to dominate. If resistors $R_3$, $R_4$ are properly selected, the positive temperature coefficient of the first term of expression [10] will exactly cancel the linear contribution of the second term of expression [10]. Under these conditions, bandgap voltage $V_{bg}$ becomes substantially independent of temperature. If transistors $Q_1$, $Q_2$ are fabricated from silicon, then the value of bandgap voltage $V_{bg}$ for which the temperature coefficient is smallest typically equals about 1.25 volts, a value that is indirectly related to the bandgap voltage of silicon. It is for this reason that voltage $V_{bg}$ is referred to as the bandgap voltage.

Adjustment of a threshold voltage at which the output of comparator apparatus 10 transition may be effected by appropriate selection of values for resistors $R_1$, $R_2$. Thus, a threshold voltage $V_{th}$ at input node 78 can be established by the relation:

$$V_{th} = \frac{R_1 + R_2}{R_2}\left[2V_T \frac{R_4}{R_3} \ln(N) + V_{be2}\right] \quad [12]$$

If one assumes that $V_{bg} \cong 1.25$ volts, then $$V_{th} \cong 1.25\left(\frac{R_1 + R_2}{R_2}\right) \quad [13]$$

That is, comparator apparatus 10 may be configured to switch (i.e., to present an output signal $V_{OUT}$ at output locus 86) at any threshold greater than approximately 1.25 volts by appropriately selecting values for resistors $R_1$, $R_2$.

As mentioned briefly earlier herein, a significant problem with comparator apparatus 10 is that it draws significant current when input voltage $V_{IN}$ at input node 78 exceeds threshold voltage $V_{th}$. Comparator apparatus 10 has five circuit limbs, so its minimum quiescent supply current $I_Q$ at the threshold is $5 \cdot I_{min}$, where $I_{min}$ is the minimum current that can be conducted through a path from supply to ground without experiencing significant variations due to junction leakage, thermal noise or other parasitics. $I_Q$ increases rapidly at higher input voltages. There is a need for a lower current comparator apparatus. A good way to realize this goal is to reduce the number of paths through which current flows from supply to ground.

Figure 2:
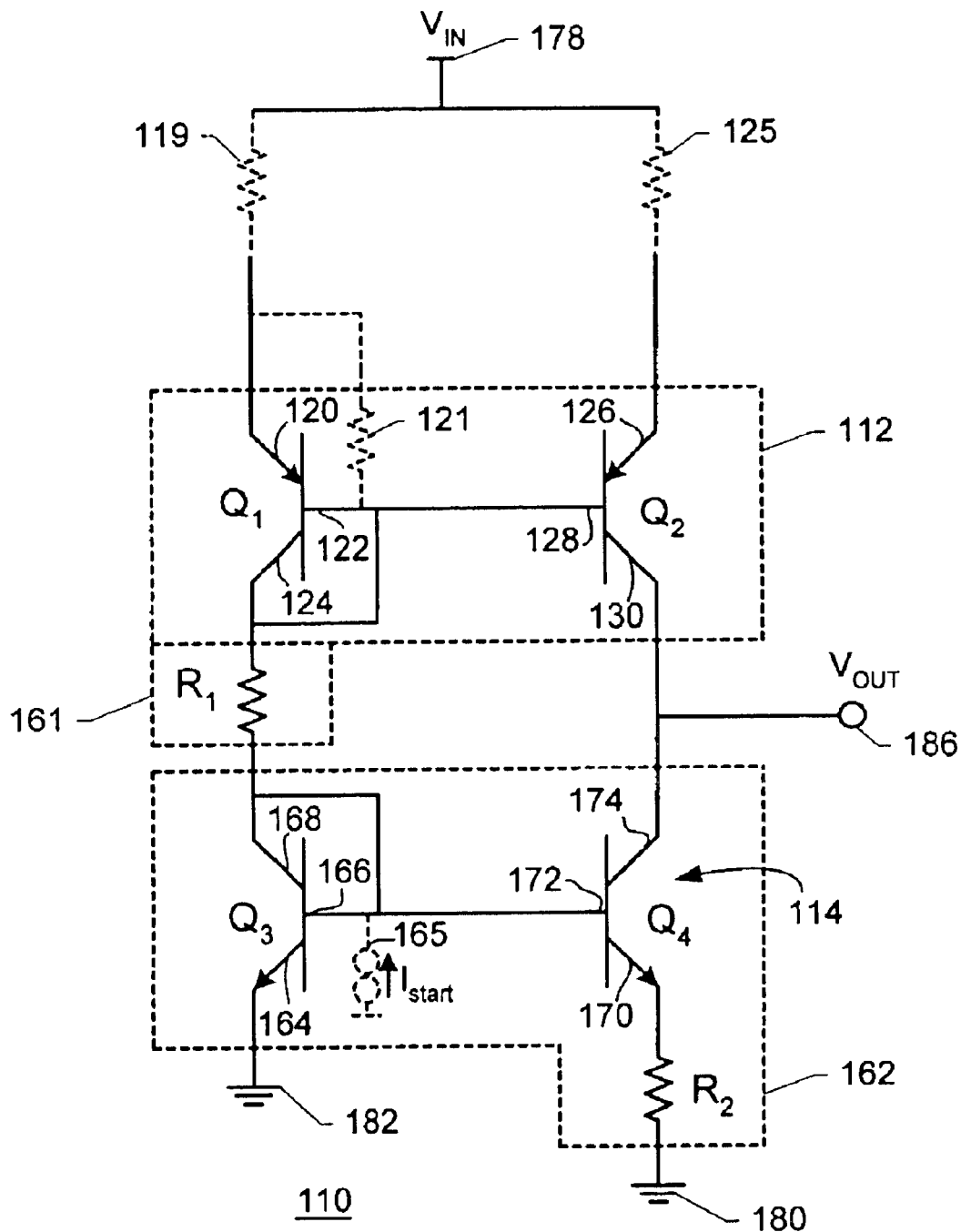
FIG. 2 is an electrical schematic diagram of a comparator apparatus constructed according to the teachings of the present invention.

FIG. 2 is an electrical schematic diagram of a comparator apparatus constructed according to the teachings of the present invention. In FIG. 2, a comparator apparatus 110 includes a first current mirror 112 and a second current mirror structure 114. Second current mirror structure 114 is coupled with an impedance, preferably a resistor $R_2$, to establish a current generating circuit 162. First current mirror 112 includes bipolar PNP transistors $Q_1$, $Q_2$; second current mirror 114 includes bipolar NPN transistors $Q_3$, $Q_4$. Bipolar transistor $Q_1$ has an emitter 120, a base 122 and a collector 124. Bipolar transistor $Q_2$ has an emitter 126, a base 128 and a collector 130. Bipolar transistor $Q_3$ has an emitter 164, a base 166 and a collector 168. Bipolar transistor $Q_4$ has an emitter 170, a base 172 and a collector 174. Base 122 of bipolar transistor $Q_1$ is coupled with collector 124 of transistor $Q_1$ and base 128 of transistor $Q_2$ to establish first current mirror 112. Base 166 of bipolar transistor $Q_3$ is coupled with collector 168 of transistor $Q_3$ and base 172 of transistor $Q_4$ to establish second current mirror structure 114. Resistor $R_2$ is coupled with emitter 170 of transistor $Q_4$ and to ground 180 to establish current generating circuit 162.

Comparator apparatus 110 also includes scaling unit or element 161. Scaling element 161 determines the threshold voltage $V_{th}$ of comparator unit 110, as will be described hereinafter. Scaling element 161 includes an impedance, preferably a resistor $R_1$ coupled in series between collector 124 and collector 168. Emitter area $A_{e2}$ of emitter 170 of transistor $Q_4$ is larger than emitter area $A_{e1}$ of emitter 164 of transistor $Q_3$ by a factor of N. That is, from expression [1]:

$$A_{e2}=N \cdot A_{e1} \quad [1]$$

Emitter 164 is coupled with ground 182. Collectors 130, 174 are coupled together. An input locus 178 is coupled with emitters 120, 126. An output locus 186 is coupled with collectors 130, 174; an output voltage $V_{OUT}$ appears at output locus 186 when voltage at input locus 178 exceeds a predetermined threshold. The threshold determination is inherent in comparator apparatus 110 and is related to the base-emitter voltages $V_{be}$ of transistors $Q_1$, $Q_3$.

At threshold voltage $V_{th}$, current mirror 112 ensures that collector currents are equal at collectors 124, 130. In such circumstances, the voltage across impedance $R_2$ (from expression [9]) is:

$$\Delta V_{be} = V_T \ln(N) \quad [9]$$

As a consequence, current through transistor $Q_2$ (and, thus, current through transistor $Q_1$) equals:

$$I_{C2} = \frac{V_T \ln(N)}{R_2} \quad [14]$$

Where $I_{C2}$ is the current through collector 130 of transistor $Q_2$.

Thus, at the balance point, the threshold voltage $V_{th}$ must equal:

$$V_{th} = V_T \frac{R_1}{R_2} \ln(N) + 2V_{be} \quad [15]$$

If threshold voltage $V_{th}$ is set to equal twice the bandgap voltage $V_{bg}$, then the temperature dependence of the threshold voltage $V_{th}$ is minimized. In such a configuration, comparator apparatus 110 acts as a bandgap comparator with a threshold of approximately 2.5 volts, a figure that is associated with the semiconductor material used in manufacturing transistors $Q_1$, $Q_2$, $Q_3$, $Q_4$. For purposes of this illustrative example, transistors $Q_1$, $Q_2$, $Q_3$, $Q_4$ are presumed to have been manufactured in silicon. In contrast to comparator apparatus 10 (FIG. 1), comparator apparatus 110 has only two circuit limb currents, so its minimum quiescent supply current $I_Q$ at the threshold is $2 \cdot I_{min}$. Thus, comparator apparatus 110 is a lower current comparator apparatus than is comparator apparatus 10 (FIG. 1).

Output impedance characteristics of comparator apparatus 110 may be improved by adding impedances 119, 125 in series with emitters 120, 126, thereby improving accuracy of threshold switching. Impedances 119, 125 are indicated in dotted line format to indicate their characterization as an alternate embodiment.

Comparator apparatus 110 has a fixed threshold voltage $V_{th}=2 \cdot V_{bg}$. Providing an impedance 121 connected between base 122 and emitter 120 of transistor $Q_1$ allows selection of a threshold voltage $V_{th}>2 \cdot V_{bg}$. Adjusting of threshold voltage $V_{th}$ is effected by appropriate selection of the value of the impedance 121. Impedance 121 is indicated in dotted line format to indicate its characterization as an alternate embodiment.

Comparator apparatus 110 does not provide a definite output signal when $V_{IN}$ is less than $2 \cdot V_{be}$. This may be corrected by injecting a small startup current $I_{start}$ from a current source 165 connected with base 166 of transistor $Q_3$. So long as startup current $I_{start}$ is much smaller than minimum current $I_{min}$ in the various current limbs of comparator apparatus 110, startup current $I_{start}$ will have little effect upon threshold voltage $V_{th}$ of comparator apparatus 110. With the addition of current source 165, the output 186 will be asserted for input voltages $V_{IN}$ as low as one $V_{be}$. Current source 165 can be implemented as a depletion-mode FET (field effect transistor), a pinched-off JFET (junction field effect transistor), or similar structure. Current source 165 is indicated in dotted line format to indicate its characterization as an alternate embodiment.

Figure 3:
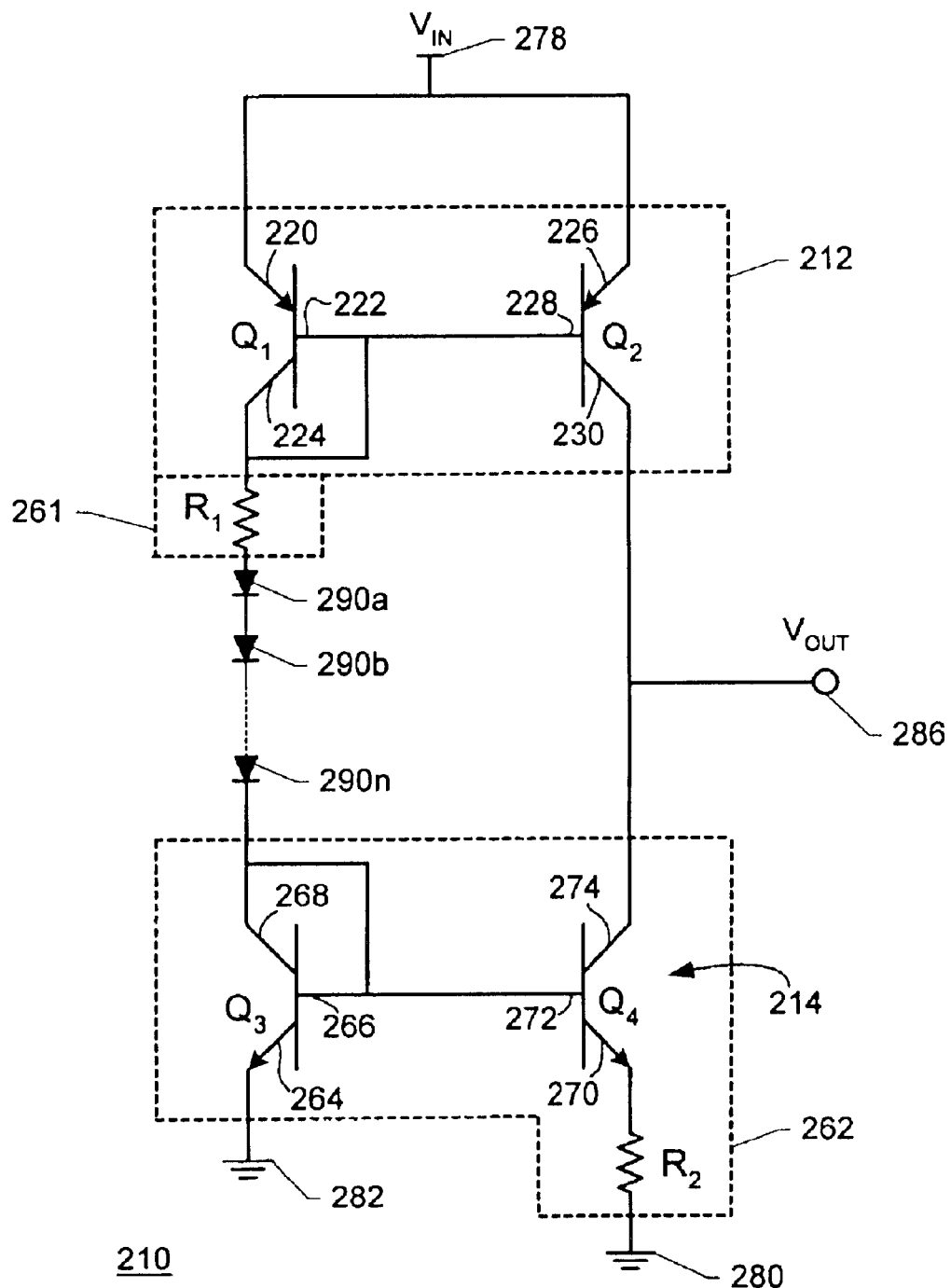
FIG. 3 is an electrical schematic diagram of a second embodiment of a comparator apparatus constructed according to the teachings of the present invention.

FIG. 3 is an electrical schematic diagram of a second embodiment of a comparator apparatus constructed according to the teachings of the present invention. In FIG. 3, a comparator apparatus 210 is substantially similar to comparator apparatus 110 (FIG. 2) with additional structure that permits establishing higher threshold voltages. Comparator apparatus 210 includes a first current mirror 212 and a second current mirror structure 214. Second current mirror structure 214 is coupled with an impedance, preferably a resistor $R_2$ to establish a current generating circuit 262. First current mirror 212 includes bipolar PNP transistors $Q_1$, $Q_2$; second current mirror structure 214 includes bipolar NPN transistors $Q_3$, $Q_4$. Bipolar transistor $Q_1$ has an emitter 220, a base 222 and a collector 224. Bipolar transistor $Q_2$ has an emitter 226, a base 228 and a collector 230. Bipolar transistor $Q_3$ has an emitter 264, a base 266 and a collector 268. Bipolar transistor $Q_4$ has an emitter 270, a base 272 and a collector 274. Base 222 of bipolar transistor $Q_1$ is coupled with collector 224 of transistor $Q_1$ and base 228 of transistor $Q_2$ to establish first current mirror 212. Base 266 of bipolar transistor $Q_3$ is coupled with collector 268 of transistor $Q_3$ and base 272 of transistor $Q_4$ to establish second current mirror structure 214. Resistor $R_2$ is coupled with emitter 270 of transistor $Q_4$ and with ground 280 to establish current generating circuit 262.

Comparator apparatus 210 also includes a scaling unit or element 261. Scaling element 261 determines the threshold voltage $V_{th}$ of comparator unit 210. Scaling element 261 includes an impedance, preferably a resistor $R_1$ coupled in series between collector 224 and collector 268. Emitter area $A_{e2}$ of emitter 270 of transistor $Q_4$ is larger than emitter area $A_{e1}$ of emitter 264 of transistor $Q_3$ by a factor of N. That is:

$$A_{e2} = N \cdot A_{e1} \quad [16]$$

Emitter 264 is coupled with ground 282. Collectors 230, 274 are coupled together. An input locus 278 is coupled with emitters 220, 226. An output locus 286 is coupled with collectors 230, 274; an output voltage $V_{OUT}$ appears at output locus 286 when voltage at input locus 278 exceeds a predetermined threshold. The threshold determination is inherent in comparator apparatus 210 and is related to the base-emitter voltages $V_{be}$ of transistors $Q_1$, $Q_3$. Threshold determination is also further related to diode elements 290a, 290b, . . . 290n coupled in series with impedance $R_1$. Diode elements 290n each add a voltage drop substantially equal to $V_{be}$ to threshold determinations for comparator apparatus 210. Diode elements 290n are illustrated as coupled between impedance $R_1$ and collector 268. Diode elements 290n could as well be coupled in series with impedance $R_1$ between collector 224 and impedance $R_1$. Diode elements 290n could be employed with the alternate embodiments indicated in comparator apparatus 110 (FIG. 2) in dotted line format.

Figure 4:
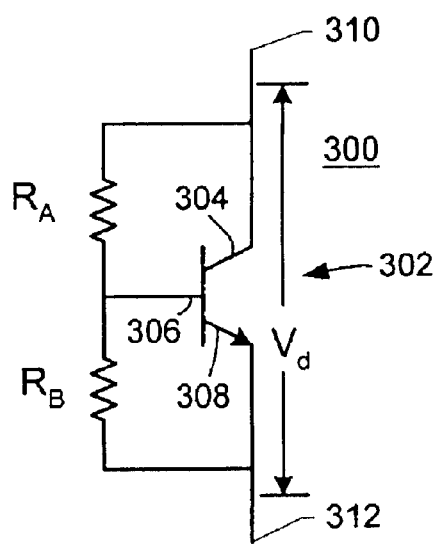
FIG. 4 is an electrical schematic diagram of a circuit segment that may be employed for constructing a third embodiment of a comparator apparatus according to the teachings of the present invention.

FIG. 4 is an electrical schematic diagram of a circuit segment that may be employed for constructing a third embodiment of a comparator apparatus according to the teachings of the present invention. In FIG. 4, a circuit segment 300 is illustrated for effecting adjustment of threshold voltage $V_{th}$. Circuit segment 300 includes an NPN bipolar transistor 302 having a collector 304, a base 306 and an emitter 308 and connection terminals 310, 312. Resistors $R_A$, $R_B$ affect the voltage drop $V_d$ between terminals 310, 312 as:

$$V_d = \frac{R_A + R_B}{R_B} \cdot V_{be} \quad [17]$$

Circuit segment 300 may be included for providing threshold level control, for example, in a comparator apparatus such as comparator apparatus 210 (FIG. 3) using connection terminals 310, 312 to couple circuit segment 300 in series with resistor $R_1$. The advantage of circuit segment 300 is that it allows continuous adjustment of the threshold voltage $V_{th}$ rather than adjustment by discrete steps, as is the case when using diodes 290n (FIG. 3). Circuit segment 300 could be employed with the alternate embodiments indicated in comparator apparatus 110 (FIG. 2) in dotted line format.

Figure 5:
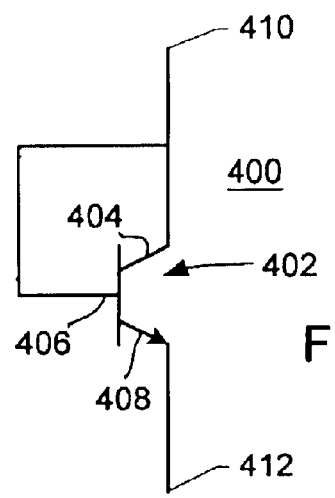
FIG. 5 is an electrical schematic diagram of a circuit segment that may be employed for constructing a fourth embodiment of a comparator apparatus according to the teachings of the present invention.

FIG. 5 is an electrical schematic diagram of a circuit segment that may be employed for constructing a fourth embodiment of a comparator apparatus according to the teachings of the present invention. In FIG. 5, a circuit segment 400 is illustrated for effecting contribution to threshold voltage $V_{th}$. Circuit segment 400 includes an NPN bipolar transistor 402 having a collector 404, a base 406 and an emitter 408 and connection termini 410, 412. Collector 404 and base 406 are coupled together to configure collector 404 as a diode-connected collector. Circuit segment 400 may be included for contributing to threshold level, for example, in a comparator apparatus such as comparator apparatus 210 (FIG. 3) using connection terminals 410, 412 to couple circuit segment 400 in series with in series with impedance $R_1$ as a substitute for a diode element 290n (FIG. 3) or in addition to a diode element 290n. Circuit segment 400 could be employed with the alternate embodiments indicated in comparator apparatus 110 (FIG. 2) in dotted line format or with circuit segment 300 (FIG. 4).

Figure 6:
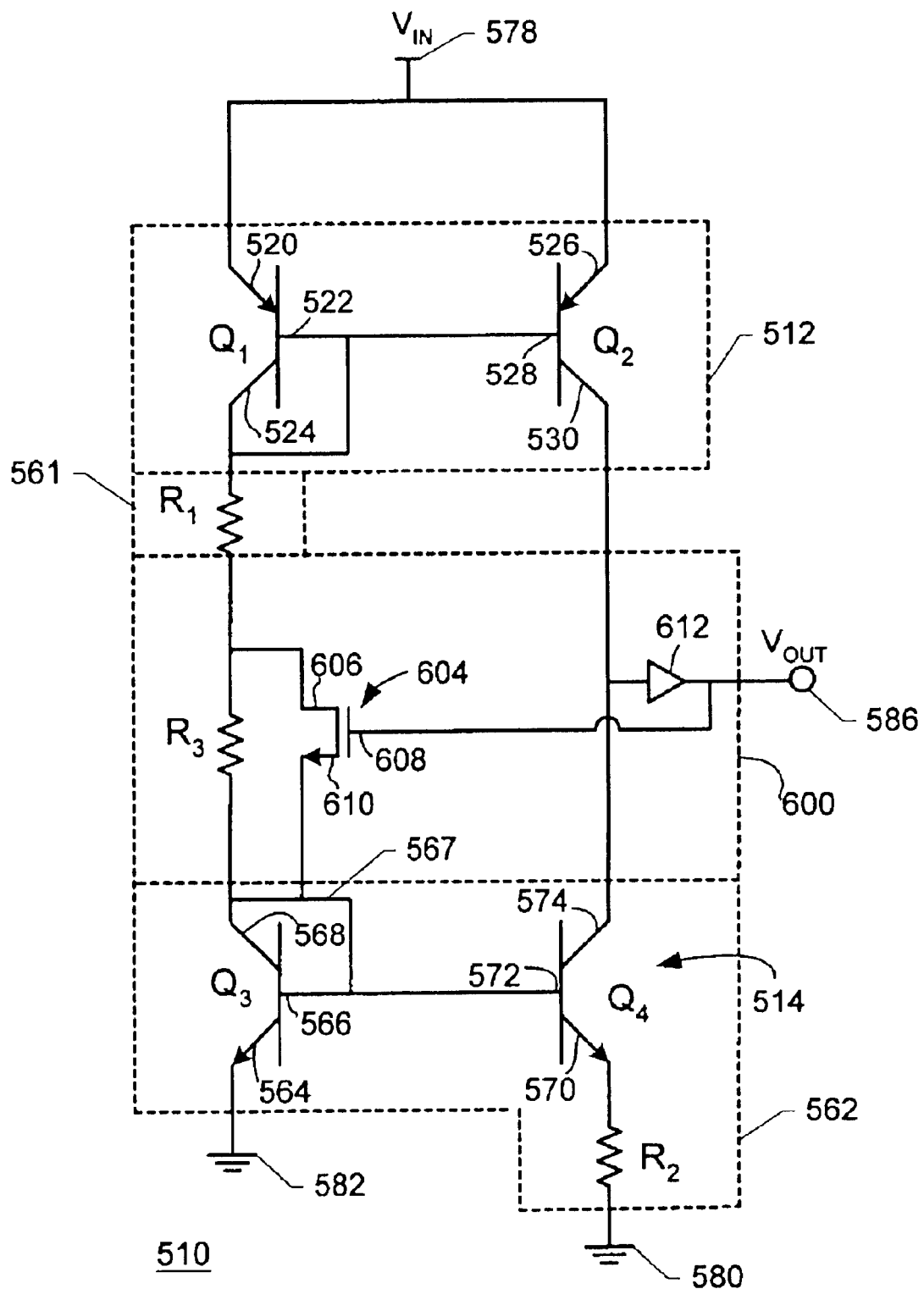
FIG. 6 is an electrical schematic diagram of a fifth embodiment of a comparator apparatus constructed according to the teachings of the present invention.

FIG. 6 is an electrical schematic diagram of a fifth embodiment of a comparator apparatus constructed according to the teachings of the present invention. In FIG. 6, a comparator apparatus 510 is substantially similar to comparator apparatus 110 (FIG. 2) with additional structure that provides hysteresis to avoid multiple transitions of the output $V_{OUT}$ during operation of comparator apparatus 510 when input $V_{IN}$ is near threshold voltage $V_{th}$. Comparator apparatus 510 includes a first current mirror 512 and a second current mirror structure 514. Second current mirror structure 514 is coupled with an impedance, preferably a resistor $R_2$ to establish a current generating circuit 562. First current mirror 512 includes bipolar PNP transistors $Q_1$, $Q_2$; second current mirror structure 514 includes bipolar NPN transistors $Q_3$, $Q_4$. Bipolar transistor $Q_1$ has an emitter 520, a base 522 and a collector 524. Bipolar transistor $Q_2$ has an emitter 526, a base 528 and a collector 530. Bipolar transistor $Q_3$ has an emitter 564, a base 566 and a collector 568. Bipolar transistor $Q_4$ has an emitter 570, a base 572 and a collector 574. Base 522 of bipolar transistor $Q_1$ is coupled with collector 524 of transistor $Q_1$ and base 528 of transistor $Q_2$ to establish first current mirror 512. Base 566 of bipolar transistor $Q_3$ is coupled with collector 568 of transistor $Q_3$ and base 572 of bipolar transistor $Q_4$ to establish second current mirror structure 514. Resistor $R_2$ is coupled to emitter 570 of transistor $Q_4$ and to ground 580 to establish current generating circuit 562.

Comparator apparatus 510 also includes a scaling unit or element 561. Scaling element 561 determines the threshold voltage $V_{th}$ of comparator unit 510. Scaling unit 561 includes an impedance, preferably a resistor $R_1$ coupled in series between collector 524 and collector 568. Emitter area $A_{e2}$ of emitter 570 of transistor $Q_4$ is larger than emitter area $A_{e1}$ of emitter 564 of transistor $Q_3$ by a factor of N. That is:

$$A_{e2} = N \cdot A_{e1} \quad [18]$$

Emitter 564 is coupled with ground 582. Collectors 530, 574 are coupled together. An input locus 578 is coupled with emitters 520, 526. An output locus 586 is coupled with collectors 530, 574; an output voltage $V_{OUT}$ appears at output locus 586 when voltage at input locus 578 exceeds a predetermined threshold. The threshold determination is inherent in comparator apparatus 510 and is related to the base-emitter voltages $V_{be}$ of transistors $Q_1$, $Q_3$.

A hysteresis circuit 600 includes a digital buffer 612 for providing an indication of output voltage $V_{OUT}$ to a MOS transistor 604. Digital buffer 612 could be constructed, for example, by a series connection of two CMOS (complementary metal oxide semiconductor) inverters. MOS transistor 604 includes a drain 606, a gate 608 and a source 610. Drain 606 is coupled in common with resistor $R_1$ and a second impedance, preferably a resistor $R_3$. Source 610 is coupled with connection 567 that commonly couples base 566 with collector 568 of bipolar transistor $Q_1$. When output 586 is low, hysteresis circuit 600 operates to raise the threshold voltage $V_{th}$. Because output 586 is low, transistor 604 does not conduct and resistor $R_3$ is placed in series with resistor $R_1$. This, in turn, increases threshold voltage $V_{th}$, as represented by expression [15]. When output 586 is high, transistor 604 conducts, effectively shorting resistor $R_3$ and reducing threshold voltage $V_{th}$. The amount of hysteresis $V_{hys}$ provided by hysteresis circuit 600 equals:

$$V_{hys} = \frac{R_3 \cdot V_t \ln(N)}{R_2} \quad [19]$$

Therefore, hysteresis circuit 600 can be adjusted to provide an arbitrarily small hysteresis. A small hysteresis is desirable because it is not possible to adjust both thresholds of apparatus 510 (FIG. 6) to zero temperature coefficients. So long as the hysteresis is less than or equal to about 50 mV, this shortcoming has little impact upon the operation of apparatus 510. Hysteresis circuit 600 could be employed with the alternate embodiments indicated in comparator apparatus 110 (FIG. 2) in dotted line format, or with circuit segment 300 (FIG. 4) or with circuit segment 400 (FIG. 5).

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. A comparator for effecting comparison of an input voltage with a threshold voltage; the comparator comprising:

(a) a first current mirror device; said first current mirror device including a first bipolar transister, having a first base and a first collector, said first base and said first collector being connected to a diode; said input voltage being received at said first current mirror device;

(b) a second current mirror device; said second current mirror device including a second bipolar transistor having a second base and a second collector, said second base and said second collector establishing a diode;

(c) a first impedance coupled in series with said diode being connected to said first collector and said diode being connected to said second collector; and (d) a second impedance coupled between ground and said second current mirror device;

said first current mirror device and said second current mirror device being further coupled with an output locus; output signals appearing at said output locus indicating comparative voltage levels of said input voltage and said threshold voltage.

2. The comparator for effecting comparison of an input voltage with a threshold voltage as recited in claim 1 wherein said first current mirror device further includes a third bipolar transistor having a third collector, and wherein said second current mirror device further including a fourth bipolar transistor having a fourth collector and an emitter; said third collector and said fourth collector being coupled with the output locus; said second impedance being coupled with said emitter of said fourth bipolar transistor.

3. The comparator for effecting comparison of an input voltage with a threshold voltage as recited in claim 1 wherein said first bipolar transistor presents a first voltage drop and said second bipolar transistor presents a second voltage drop, said threshold voltage being established as a function of said first voltage drop and said second voltage drop.

4. An apparatus for effecting comparison of an input voltage with a threshold voltage; the apparatus comprising:

(a) a current mirror; said current mirror including a first bipolar transistor having a first base, a first emitter, and a first collector; and a second bipolar transistor having a second base, a second emitter and a second collector; said first base being coupled to said first collector and said second base; said input voltage being received at said first emitter and said second emitter;

(b) a current generating circuit; said current generating circuit including a third bipolar transistor having a third base, a third emitter and a third collector, a fourth bipolar transistor having a fourth base, a fourth emitter and a fourth collector; and a first resistor; said third base being coupled with said third collector and said fourth base; said first resistor being coupled between said fourth emitter and a common voltage potential; said third emitter being coupled with said common voltage potential; and (c) a scaling element coupled between said first collector and said third collector; said second collector being coupled with said fourth collector and with an output node; output signals appearing at said output node indicating relative voltage levels of said input voltage and said threshold voltage, wherein said third fourth collector and said second collector being coupled with an output locus; and wherein said second bipolar transistor and said fourth bipolar transistor are of unequal size; one bipolar transistor of said second bipolar transistor and said fourth bipolar transistor being larger than the other bipolar transistor of said second bipolar transistor and said fourth bipolar transistor by a factor of N.

5. An apparatus for effecting comparison of an input voltage with a threshold voltage as recited in claim 4 wherein the apparatus has a configuration for substantially consistent operational response over a range in temperature.

6. An apparatus for effecting comparison of an input voltage with a threshold voltage as recited in claim 4 wherein said threshold voltage is rendered substantially independent of temperature by selection of said first resistor, said scaling element and said factor of N.

7. An apparatus for effecting comparison of an input voltage with a threshold voltage; the apparatus comprising:

(a) a current mirror; said current mirror including a first bipolar transistor having a first base, a first emitter, and a first collector; and a second bipolar transistor having a second base, a second emitter and a second collector; said first base being coupled to said first collector and said second base; said input voltage being received at said first emitter and said second emitter;

(b) a current generating circuit; said current generating circuit including a third bipolar transistor having a third base, a third emitter and a third collector; a fourth bipolar transistor having a fourth base, a fourth emitter and a fourth collector; and a first resistor; said third base being coupled with said third collector and said fourth base; said first resistor being coupled between said fourth emitter and a common voltage potential; said third emitter being coupled with said common voltage potential; and (c) a scaling element coupled between said first collector and said third collector; said second collector being coupled with said fourth collector and with an output node; output signals appearing at said output node indicating relative voltage levels of said input voltage and said threshold voltage, wherein said current mirror further includes a fifth bipolar transistor having a fifth collector, and wherein said fourth collector and said second collector being coupled with an output locus; and wherein said second bipolar transistor and said fourth bipolar transistor are of unequal size; one bipolar transistor of said second bipolar transistor and said fourth bipolar transistor being larger than the other bipolar transistor of said second bipolar transistor and said fourth bipolar transistor by a factor of N.

8. An apparatus for effecting comparison of an input voltage with a threshold voltage as recited in claim 7 wherein the apparatus has a configuration for substantially consistent operational response over a range in temperature.

9. A comparator for effecting comparison of an input voltage with a threshold voltage; the comparator comprising:
(a) a first current mirror device; said first current mirror device including a first bipolar transistor having a first base and a first collector, said first base and said first collector establishing a diode-connected first collector; said input voltage being received at said first current mirror device;
(b) a second current mirror device; said second current mirror device including a second bipolar transistor having a second base and a second collector, said second base and said second collector establishing a diode-connected second collector;
(c) a first impedance coupled in series with said diode connected first collector and said diode connected second collector; and
(d) second impedance coupled between ground and said second current mirror device;
said first current mirror device and said second current mirror device being further coupled with an output locus; output signals appearing at said output locus indicating comparative voltage levels of said input voltage and said threshold voltage,
wherein said first bipolar transistor presents a first voltage drop and said second bipolar transistor presents a second voltage drop, and wherein the comparator further comprises at least one additional device in series with said first impedance; each respective device of said at least one additional device presenting a respective additional voltage drop; said threshold voltage being established as a function of said first voltage drop, said second voltage drop and said at least one said respective additional voltage drop, and
wherein the comparator has a configuration for substantially consistent operational response over a range in temperature; said configuration being effected by a combination of integer N, said first impedance and said second impedance.

10. The comparator for effecting comparison of an input voltage with a threshold voltage as recited in claim 9 wherein the second current mirror device includes a third bipolar transistor, said second bipolar transistor and said third bipolar transistor are of unequal size; one bipolar transistor of said second bipolar transistor and said third bipolar transistor being larger than the other bipolar transistor of said second bipolar transistor and said third bipolar transistor by a factor of N.

11. An apparatus for effecting comparison of an input voltage with a threshold voltage; the apparatus comprising:
(a) a first current mirror device; said first current mirror device including a first bipolar transistor having a first base and a first collector, said first base and said first collector establishing a diode-connected first collector; said input voltage being received at said first current mirror device;
(b) a second current mirror device; said second current mirror device including a second bipolar transistor having a second base and a second collector, said second base and said second collector establishing a diode-connected second collector;
(c) a first impedance coupled in series with said diode connected first collector and said diode connected second collector; and
(d) a second impedance coupled between ground and said second current mirror device;
said first current mirror device and said second current mirror device being further coupled with an output locus; output signals appearing at said output locus indicating relative voltage levels of said input voltage and said threshold voltage,
wherein the apparatus further comprises a third impedance; said third impedance being coupled in series with said first impedance between said first current minor device and said second current mirror device; said third impedance including a switching device coupled with said output locus; said switching device switchably bypassing said third impedance in response to said output signals.

12. An apparatus for effecting comparison of an input voltage with an inherent threshold voltage as recited in claim 11 wherein said first bipolar transistor presents a first voltage drop and said second bipolar transistor presents a second voltage drop, and wherein the apparatus further comprises at least one additional device in series with said first impedance; each respective device of said at least one additional device presenting a respective additional voltage drop; said threshold voltage being established as a function of said first voltage drop, said second voltage drop and said at least one said respective additional voltage drop.

13. An apparatus for effecting comparison of an input voltage with an inherent threshold voltage as recited in claim 12 wherein the second current mirror device includes a third bipolar transistor, said third bipolar transistor occupies a larger area than said second bipolar transistor by a factor of N; the apparatus having a configuration for substantially consistent operational response over a range in temperature; said configuration being effected by a combination of N, said first impedance and said second impedance.

14. An apparatus for effecting comparison of an input voltage with a threshold voltage; the apparatus comprising:
(d) a first current mirror device; said first current mirror device including a first bipolar transistor having a first base and first collector, said first base and said first collector establishing a diode-connected first collector; said input voltage being received at said first current mirror device;
(e) a second current mirror device; said second current mirror device including a second bipolar transistor having a second base and a second collector, said second base and said second collector establishing a diode-connected second collector;
(f) a first impedance coupled in series with said diode connected first collector and said diode connected second collector; and
(d) second impedance coupled between ground and said second current mirror device;
said current mirror device and said second current mirror device being further coupled with an output locus; output signals appearing at said output locus indicating relative voltage levels of said input voltage and said threshold voltage;

wherein said first bipolar transistor presents a first voltage drop and said second bipolar transistor presents a second voltage drop, and wherein the apparatus further comprises at least one additional device in series with said first impedance; each respective device of said at least one additional device presenting a respective additional voltage drop; said threshold voltage being established as a function of said first voltage drop, said second voltage drop and said at least one said respective additional voltage drop, wherein the apparatus has a configuration for substantially consistent operational response over a range in temperature; said configuration being effected by a combination of integer N, said first impedance and said second impedance, wherein the second current mirror device includes a third bipolar transistor, said second bipolar transistor and said third bipolar transistor are of unequal size; one bipolar transistor of said second bipolar transistor and said third bipolar transistor being larger than the other bipolar transistor of said second bipolar transistor and said third bipolar transistor by a factor of N, and wherein the apparatus further comprises a third impedance; said third impedance being coupled in series with said first impedance between said first current mirror device and said second current mirror device; said third impedance including a switching device coupled with said output locus; said switching device switchably bypassing said third impedance in response to said output signals.

15. A comparator for effecting comparison of an input voltage with a threshold voltage; the comparator comprising:

(a) a first current mirror device; said first current mirror device including a first bipolar transistor having a first base and a first collector, said first base and said first collector being connected to a diode; said input voltage being received at said first current mirror device;

(b) a second current mirror device; said second current mirror device including a second bipolar transistor having a second base and a second collector, said second base and said second collector establishing a diode-connected second collector;

(c) a first impedance coupled in series with said diode connected first collector and said diode connected second collector; and (d) a second impedance coupled between ground and said second current mirror device;

said first current mirror device and said second current mirror device being further coupled with an output locus; output signals appearing at said output locus indicating relative comparative voltage levels of said input voltage and said threshold voltage, wherein said comparator includes a scaling element being the first impedance coupled in series with the diode.

16. An apparatus for effecting comparison of an input voltage with a threshold voltage; the apparatus comprising:

(a) a current mirror; said current mirror including a first bipolar transistor having a first base, a first emitter, and a first collector; and a second bipolar transistor having a second base, a second emitter and a second collector; said first base being coupled to said first collector and said second base; said input voltage being received at said first emitter and said second emitter;

(b) a current generating circuit; said current generating circuit including a third bipolar transistor having a third base, a third emitter and a third collector; a fourth bipolar transistor having a fourth base, a fourth emitter and a fourth collector; and a first resistor; said third base being coupled with said third collector and said fourth base; said first resistor being coupled between said fourth emitter and a common voltage potential; said third emitter being coupled with said common voltage potential, and (c) a scaling element coupled between said first collector and said third collector; said second collector being coupled with said fourth collector and with an output node; output signals appearing at said output node indicating relative voltage levels or said input voltage and said threshold voltage, wherein said fourth bipolar transistor has a first emitter area and said third bipolar transistor has a second emitter area; said first emitter area being greater than said second emitter area by a factor of N, wherein said scaling element is coupled with said output node; said scaling element being variable; said scaling element responding to voltage present at said output node for adjusting said threshold voltage.

\* \* \* \* \*